United States Patent [19]

Lewis et al.

[11] Patent Number: 5,260,657
[45] Date of Patent: Nov. 9, 1993

[54] MAGNETIC RESONANCE SPECTROSCOPY SAMPLE SPINNING APPARATUS WITH MECHANICAL BEARING

[75] Inventors: David H. Lewis; Robert A. Wind, both of Fort Collins, Colo.

[73] Assignee: Otsuka Electronics (U.S.A.) Inc., Ft. Collins, Colo.

[21] Appl. No.: 857,884

[22] Filed: Mar. 26, 1992

[51] Int. Cl.⁵ ............................................. G01R 33/20
[52] U.S. Cl. .................................... 324/321; 324/307
[58] Field of Search ............... 324/300, 307, 318, 321, 324/322

[56] References Cited

U.S. PATENT DOCUMENTS

| | | | |
|---|---|---|---|
| 4,201,941 | 5/1980 | Fyfe et al. | 324/321 |
| 4,275,350 | 6/1981 | Hill et al. | 324/321 |
| 4,899,111 | 2/1990 | Pines et al. | 324/321 |
| 4,940,942 | 7/1990 | Bartuska et al. | 324/321 |
| 4,968,939 | 11/1990 | Pines et al. | 324/321 |

OTHER PUBLICATIONS

Ceramic Bearing Catalog of MPB Corporation, published Fall 1991.
Joseph Edward Shigley, Mechanical Engineering Design, 3rd edition (latest printing 1977), sections of Chs. 9 and 10 relating to Antifriction Bearings.

*Primary Examiner*—Michael J. Tokar
*Attorney, Agent, or Firm*—Jean M. Macheledt

[57] ABSTRACT

A spinning apparatus for conducting magnetic resonance spectroscopy on a sample, having: an inner holder for the sample; mechanism for spinning the inner holder, while positioned in a magnetic field, about its axis; and a substantially nonmagnetic mechanical first bearing for supporting the first end-portion of the inner holder. Also, a spinning apparatus having: an inner holder for the sample; mechanism for spinning the inner holder, while positioned in a magnetic field, about its axis; a first and second bearing for supporting, respectively, a first and second end-portion of the inner holder; an outer housing for retaining the inner holder; mechanism for spinning the outer housing about its axis; and a substantially nonmagnetic mechanical third bearing for supporting the right end-portion of the outer housing. Also included is a device for measuring the magnetic resonance spectrum of a sample.

29 Claims, 8 Drawing Sheets

MAGNETIC RESONANCE SPECTROSCOPY SAMPLE SPINNING APPARATUS WITH MECHANICAL BEARING

BACKGROUND OF THE INVENTION

In general this invention relates to sample spinning apparatuses for use in magnetic resonance spectroscopy systems, more particularly, it relates to apparatuses for holding samples which are spun in order to produce the sample's spectrum using nuclear magnetic resonance (NMR).

NMR (or, simply, Magnetic Resonance) spectroscopy is a non-destructive technique used to produce the spectrum of a liquid, solid, or gas sample so that the sample's structure or composition can be identified. This sample-identification technique is based upon the known fact that when substances containing nuclear spins are subjected to both a static magnetic field and an alternating electromagnetic field at a certain frequency and orientation, the substances emit radiation which is characteristic of the substances' molecular and atomic structure. Samples are placed within the strong magnetic field (typically 1-10 Tesla) produced by a large main, outer magnet as well as the field produced by a radio-frequency (RF) coil. If solid samples are not rotated at high speeds (typically 30,000-1,500,000 rpm) while positioned within the fields, the information available from the samples' spectrum is limited. Since the discovery of this fact, NMR spectroscopy is mainly performed on spinning samples. The requirement that samples be spun has created problems for the designers of NMR spectroscopy equipment.

Various sample spinning techniques exist to date. Magic Angle Spinning (MAS) is one spinning technique wherein the sample is rotated about its axis at an angle approximately 54.7 degrees (called the "magic angle") from the direction of the external static magnetic field generated by a large outer magnet. U.S. Pat. No. 4,940,942 issued to Bartuska et al. describes a MAS spin mechanism for use in Variable Temperature (VT) NMR spectroscopy. VT NMR spectroscopy is the technique used to produce the spectrum of a sample spun at a temperature other than the temperature at which the NMR equipment is operating. U.S. Pat. No. 4,899,111 issued to Pines et al. describes: (1) a technique often referred to as Double Rotation (DOR) wherein a sample or inner sample holder is rotated about its axis, while at the same time being spun in a "central cylinder" to allow the sample to precess; and (2) in column 11 of that patent, a technique often referred to as Dynamic Angle Spinning (DAS) wherein a sample or sample holder is rotated about its axis, while at the same time being pivoted. Doty Scientific, Inc. manufactures NMR spectrometer spinning mechanisms which operate using the DAS technique.

U.S. Pat. No. 4,968,939 issued to Pines et al. illustrates in FIG. 5 an apparatus that mechanically varies the orientation of a sample for measuring the sample's NMR spectra.

None of the known sample spinning devices used for obtaining the magnetic resonance spectra of samples are designed with mechanical bearings for allowing samples to freely spin with greater stability. All known NMR spectroscopy sample spinning devices (including those used for DOR, DAS, and MAS) use air/gas bearings for low-friction, high speed spinning of sample holders and outer housings. Air/gas bearings used in this manner cannot adequately support spinning samples, sample holders, or outer housings under all desirable circumstances. Turbulence due to injecting pressurized bearing gas against a large spinning sample, sample holder, or outer housing may cause the spinning component to wobble (or be unstable) at high speeds. Furthermore, maintaining the position of the sample or inner sample holder in a DOR system is difficult to do using air/gas bearings.

SUMMARY OF THE INVENTION

It is a primary object of this invention to provide a sample spinning apparatus (for conducting magnetic resonance spectroscopy) having greater stability while being spun and which eliminates at least one air bearing.

Advantages of providing a sample spinning apparatus as described herein are: (a) simplify the design of sample spinners; (b) the temperature gradient along a sample being analyzed using variable temperature (VT) magnetic resonance spectroscopy can be reduced; (c) a spinning apparatus having at least one less air/gas supply is more compact and may cost less to fabricate; (d) providing greater stability allows NMR spectroscopy to be used more "routinely" to analyze samples; and (e) rotation of the samples or sample holders may be more easy to control.

Briefly described, the invention includes a spinning apparatus for conducting magnetic resonance spectroscopy on a sample, having: an inner holder for the sample; means for spinning the inner holder, while positioned in a magnetic field, about its axis; and a substantially nonmagnetic mechanical first bearing for supporting the first end-portion of the inner holder. The mechanical bearing can be an annular ball bearing, an annular roller bearing, or a lubricated sleeve bearing or bushing. The first end-portion of the inner holder can be a shaft.

Another characterization includes a spinning apparatus having: an inner holder for the sample; means for spinning the inner holder, while positioned in a magnetic field, about its axis; a first and second bearing for supporting, respectively, a first and second end-portion of the inner holder; an outer housing for retaining the inner holder; means for spinning the outer housing about its axis; and a substantially nonmagnetic mechanical third bearing for supporting the right end-portion of the outer housing.

A final characterization includes a device for measuring the magnetic resonance spectrum of a sample. Such a device has an inner holder for the sample; means for spinning the inner holder, while positioned in a magnetic field, about its axis; a substantially nonmagnetic mechanical first bearing for supporting the first end-portion of the inner holder; a radio-frequency coil surrounding at least a portion of the sample; and means for receiving a magnetic resonance signal emitted from the sample.

BRIEF DESCRIPTION OF THE DRAWINGS

The invention will be more particularly described by referencing the accompanying drawings of the preferred embodiments, in which like numerals designate like parts.

DETAILED DESCRIPTION OF THE PREFERRED EMBODIMENTS

Figure 1:
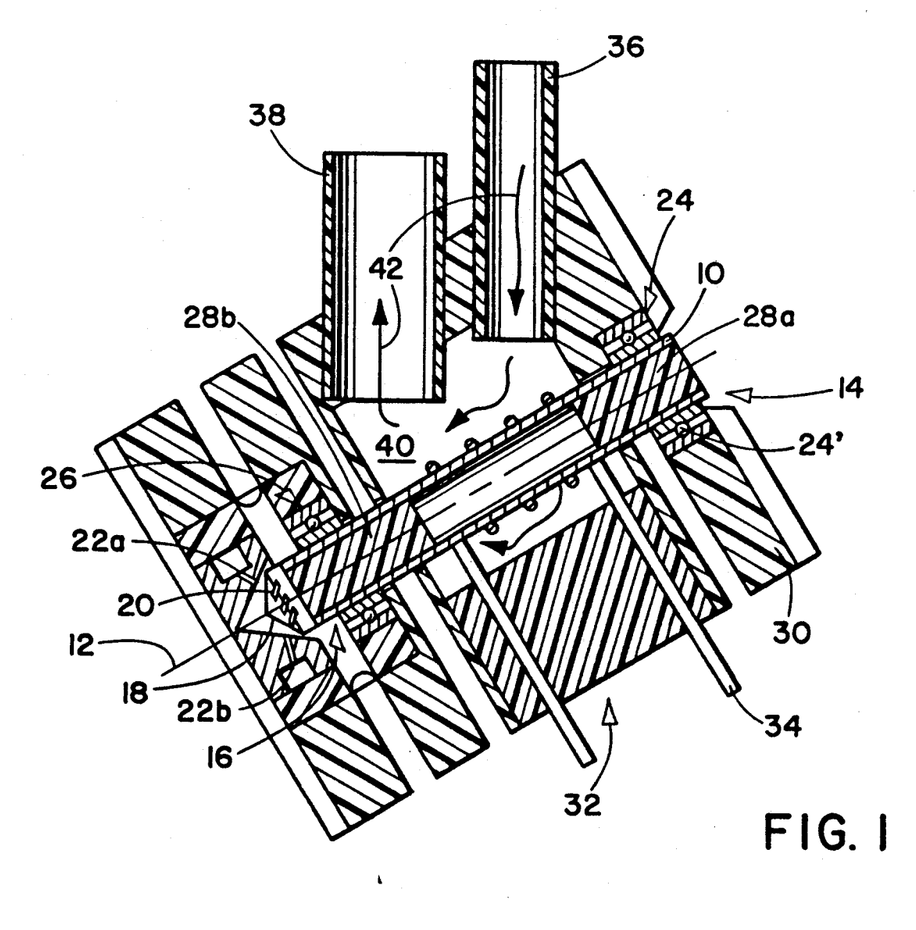
FIG. 1 is a sectional view of a preferred spinning apparatus of the invention including a stator assembly.

The spinning apparatus of FIG. 1 can be used in VT magnetic resonance spectroscopy. Inner holder 10, typically made of glass, ceramic, or plastic, is used for holding a sample (not shown, but which could be a fluid or solid plug, powder, or pieces) between end-plugs 28a, 28b. End-plugs 28a, 28b can be made of insulating material to aid in maintaining the desired temperature of the sample being spun. Turbine blades 20 of turbine 18, located at the inner holder's end-portion 16, aid in spinning the holder when a stream of fluid, such as air or nitrogen gas, is directed through ports 22a, 22b at the turbine. Mechanical bearings 24 and 26, having spheres such as those shown at 24', are mounted to stator assembly 30 to support the inner holder end-portions 14, 16 during rotation. Although shown as ball bearings, the two bearings 24, 26 can be suitable combinations of annular ball bearings, annular roller bearings, or lubricated sleeve bearings or bushings (see discussion of FIGS. 2a–2d for further detail of such bearings). Plug-in coil assembly 32 includes a helical RF "trans-ceiver" coil 34 which is capable of transmitting and receiving RF signals. Preferably, RF coil 34 is positioned to surround the sample-holding cavity (not labeled) of inner holder 10 between end-plugs 28a, 28b. Separate transmitter and receiver coils can be used in place of one trans-ceiver coil. If necessary, RF coil 34 could be built to surround stator assembly 30 rather than inner holder 10.

A gas such as air or nitrogen, cooled or heated to a desired temperature, can be injected into stator cavity 40 by way of a supply line 36. A substantial amount of the gas will exit through exhaust pipe 38. Arrows 42 show the general direction of flow of the gas.

Magnetic resonance spectroscopy utilizes, among other things, the strong static magnetic field generated by a large outer magnet (typically a superconducting magnet, electromagnet, or permanent magnet) and an RF field generated by an RF coil to measure a sample's spectrum. For simplicity, the outer magnets have been omitted from all figures.

Figure 2A:
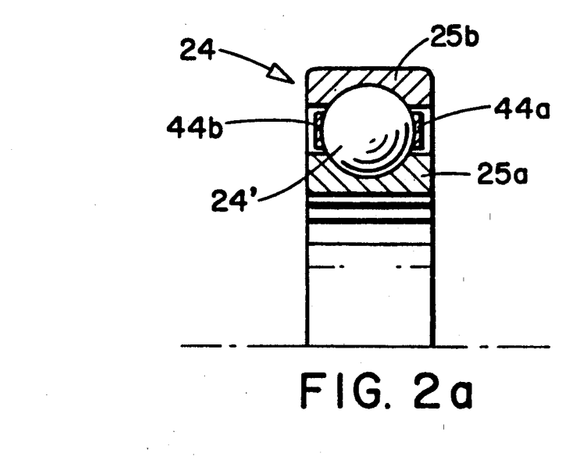
FIG. 2a is a partial sectional view of an annular ball bearing.

The enlarged, annular ball bearing 24 in FIG. 2a has an inner ring 25a, an outer ring 25b, spheres such as that shown at 24', and separator/retainer halves 44a, 44b. The annular roller bearing 46 of FIG. 2b has an inner ring 47a, an outer ring 47b, rollers such as that shown at 46', and separator/retainer halves (not labeled).

Figure 2B:
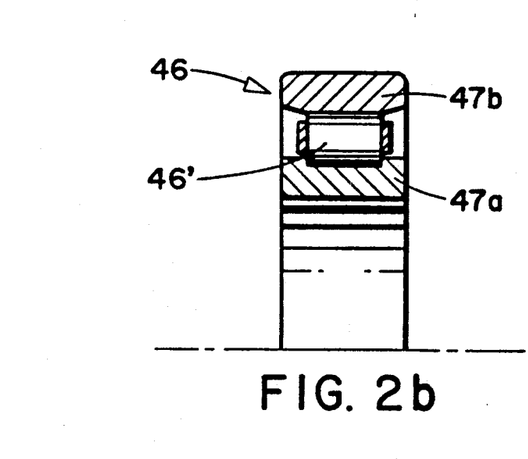
FIG. 2b is a partial sectional view of an annular roller bearing.

Since spheres 24', rollers 46', inner and outer rings 25a, 25b, 47a, 47b, and separator/retainer halves 44a, 44b will be positioned within RF and magnetic fields, it is critical that these components be made of materials which are both substantially nonmagnetic (i.e. substantially dia-magnetic or para-magnetic) and substantially nonconductive such as ceramics, glasses, and high strength wear-resistant plastics. Reasoning for this is as follows. Electrical currents are induced in conductive components positioned within an electromagnetic field generated by the acceleration and/or deceleration of moving electric charges--conductive components carrying induced currents will generate their own fields. Ferro-magnetic components placed within an electromagnetic field will become magnetized. In a spinning apparatus for conducting magnetic resonance spectroscopy on a relatively small sample, components which generate their own fields will produce inhomogeneities in the static magnetic and RF fields. This can negatively affect a sample's spectrum. Furthermore, electrical charges set in motion from the spinning of conductive components interact with the large static magnetic fields of an NMR magnet creating undesirable forces which can negatively affect the spinning of a sample.

Ceramics suitable for use as bearing components include silicon nitride, zirconia oxide, silicon carbide, alumina, periclase, and porcelain—MPB Corporation, a subsidiary of the Timken Company, manufactures and sells suitable ceramic bearing components. Suitable glasses for bearing components include PYREX ®, VYCOR ®, spin glass, and silica glass. Suitable high strength wear-resistant plastics for bearing components include polyamide resin (a product of polymerization of amino acid or the condensation of a polyamine with a polycarboxylic acid, an example of which is nylon) and polyimide resin (such as VESPEL ® a registered trademark of the E.I. du Pont de Nemours & Co.). Amoco Chemicals Corporation manufactures and sells suitable poly(amide-imide)s under the registered trademark of TORLON ® 4301 and 4203 resins.

Figure 2C:
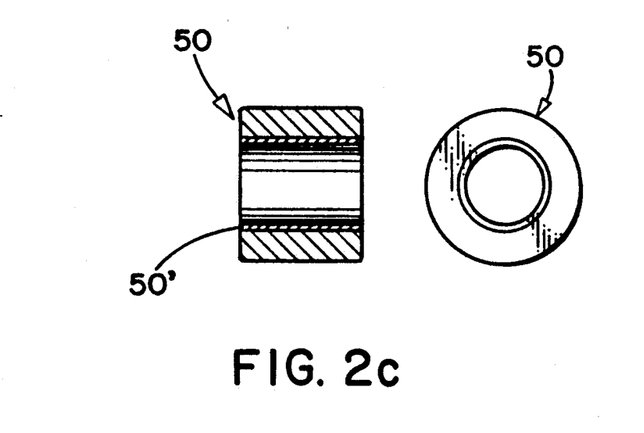
FIG. 2c has two views of a lined bushing: a sectional view and a right-hand elevational side view.
Figure 2D:
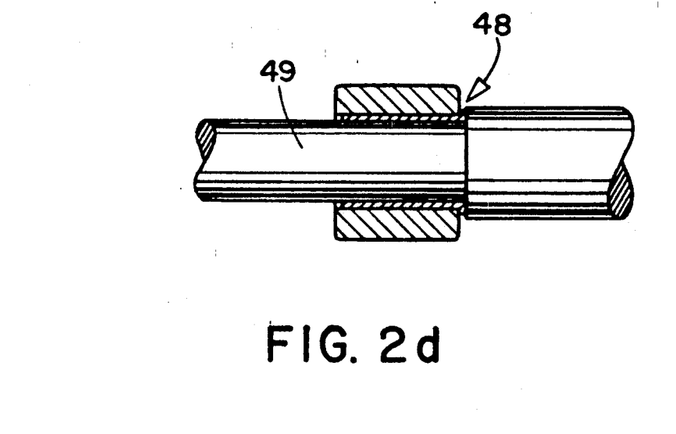
FIG. 2d is a sectional view of a flanged sleeve bearing assembled with a shaft.

The bushing 50 in FIG. 2c has been lined 50' with, for example, (1) a nonmagnetic, high strength, non-stick coating material such as TEFLON, VESPEL ®, or TORLON ® 4301 or (2) a lubrication added to a cylindrical ceramic or high strength wear-resistant plastic cylindrical piece. The sleeve bearing 48 of FIG. 2d is shown assembled with a shaft 49. The sleeve 48 can be made of a ceramic or high strength wear-resistant plastic; it is important that the wear surface of sleeve 48 either be "low-friction" or lubricated.

The well known MechE textbook Mechanical Engineering Design (third edition) by Joseph Edward Shigley describes other suitable bearings not illustrated herein as well as suitable methods of mounting mechanical bearings. Bearings can be press-fit into the positions illustrated in the embodiments disclosed herein.

Figure 3:
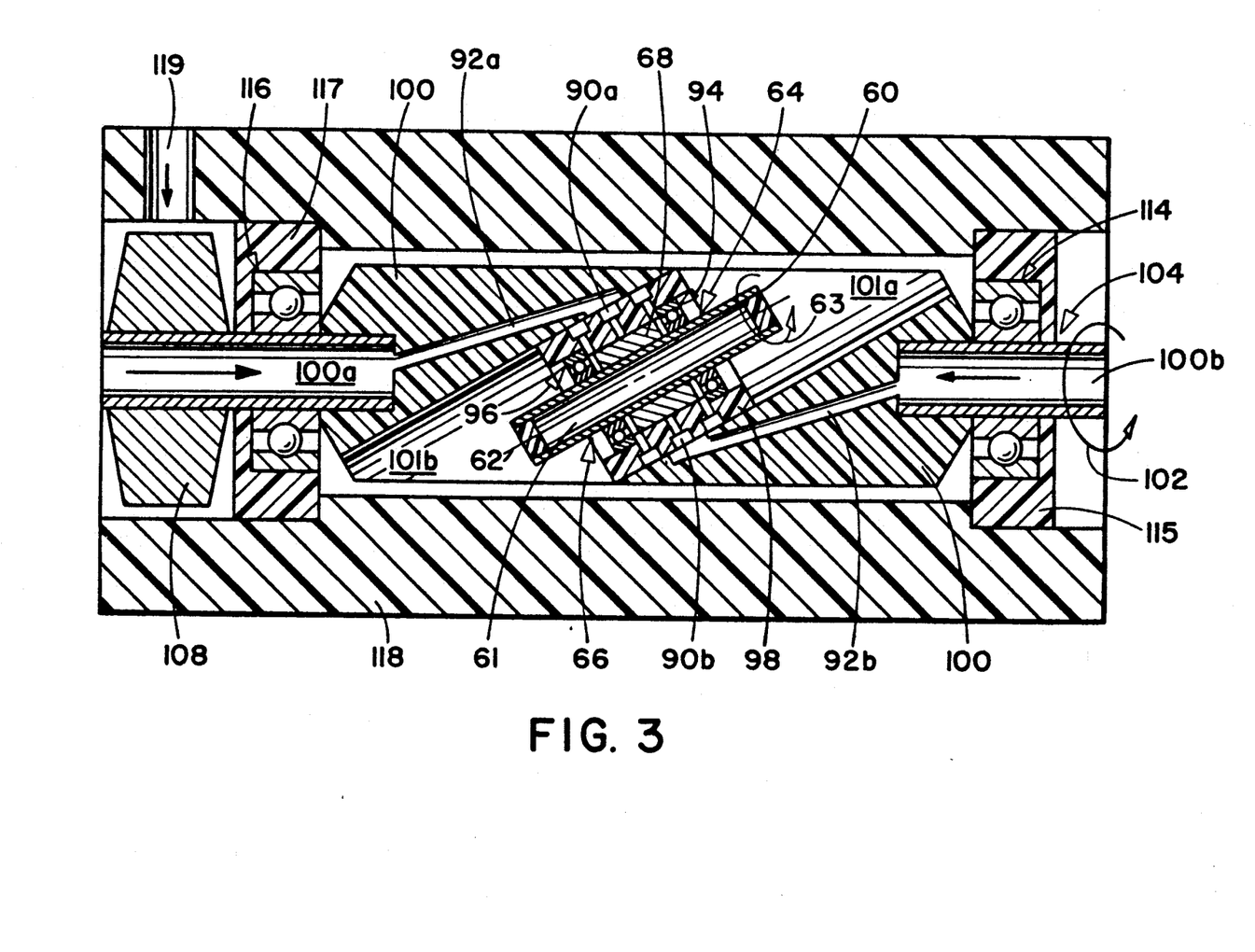
FIG. 3 is a sectional view of another preferred spinning apparatus of the invention capable of two-axis sample spinning.

Inner holder 60 of FIG. 3 is used for retaining a sample within cavity 61. Turbine 68, located around inner holder 60, aids in spinning the holder about its axis 62 in direction 63 when a stream of fluid, such as air or nitrogen gas, is directed at turbine 68 through passages 100a to 92a and 100b to 92b and ports 90a, 90b. Mechanical bearings 94 and 96 are mounted to stator assembly 98 to support the inner holder end-portions 64, 66 during rotation. Although shown as ball bearings, the two bearings 94, 96 can be suitable combinations of annular ball bearings, annular roller bearings, or lubricated sleeve bearings or bushings (see also discussion of FIGS. 2a-2d).

Outer housing 100 (preferably made of a ceramic or a plastic material such as VESPEL ®, or TORLON ®) is spun about its axis (not labeled) in direction 102 when a stream of fluid is directed at turbine 108 through passage 119. Cavities 101a, 101b have been machined into outer housing 100 to allow for free rotation of inner holder 60. Mechanical bearings 114, 116 are press-fit into bearing retaining rings 115, 117 made of a high strength plastic such as VESPEL ®, or TORLON ®. Bearing retaining rings 115, 117 support the outer housing end-portions (not labeled) during rotation. Bearing retaining rings 115, 117 are mounted to an exterior housing 118 (preferably made of a ceramic or a plastic material such as VESPEL ®, or TORLON ®). Typically inner holder 60 must be capable of spinning at a rate that is at least five times the spinning rate of outer housing 100. For example, if outer housing 100 is spun from zero to 60,000 rev/min. then inner holder 60 should be capable of spinning up to 300,000 rev/min.

Figure 4:
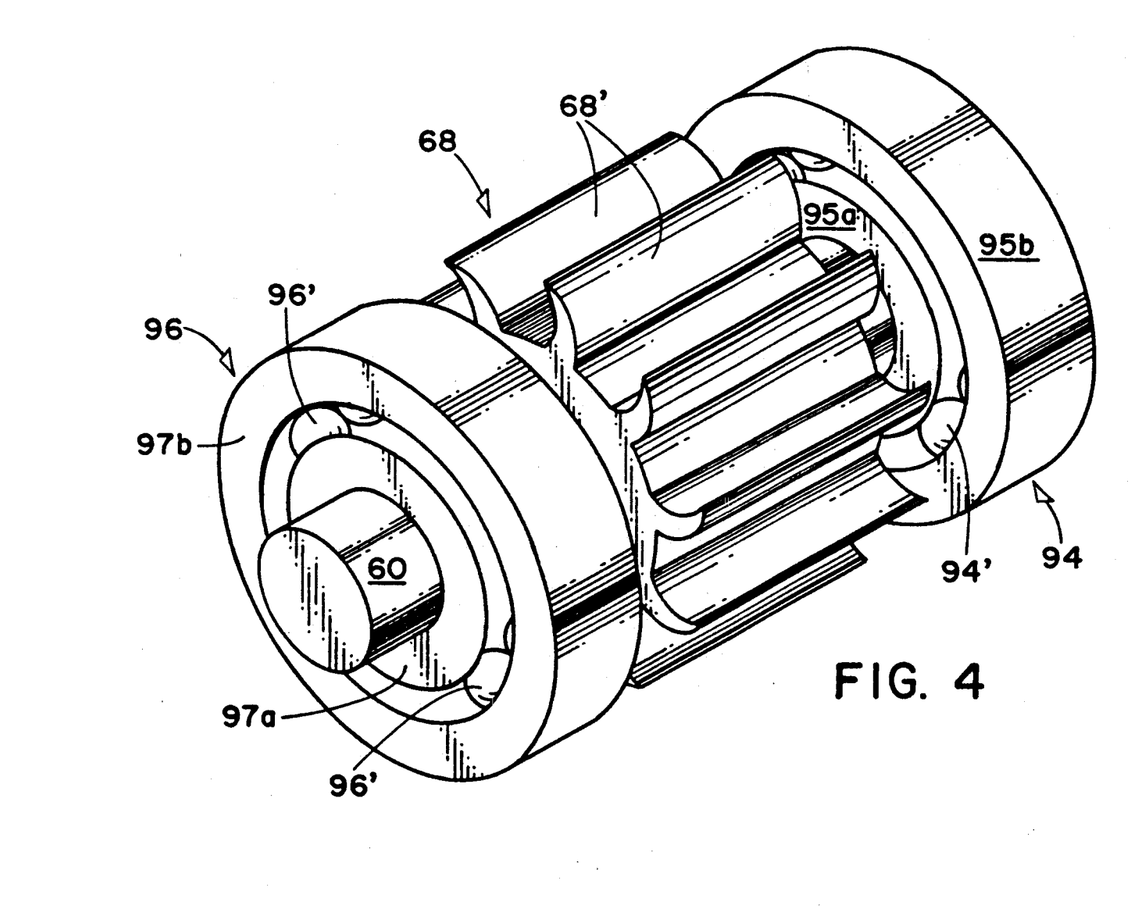
FIG. 4 is an isometric pictorial of an enlarged subassembly of components of the inner spinning apparatus in FIG. 3.

The spinning apparatus of FIG. 4 (an enlargement of components shown in FIG. 3) shows the turbine blades 68' of turbine 68 which is preferably machined into one piece out of a ceramic (such as silicon nitride or zirconia oxide) or a plastic material (such as VESPEL ®, or TORLON ®). Nearby each end-portion of inner holder 60 is an annular ball bearing 94, 96. Bearing 94 has an outer ring 95b, an inner ring 95a, and spheres at 94'. Bearing 96 has an outer ring 97b, an inner ring 97a, and spheres at 96'. The apparatus of FIGS. 3 and 4 utilizes aspects of the NMR spectroscopy sample spinning technique often referred to as DOR.

Figure 5:
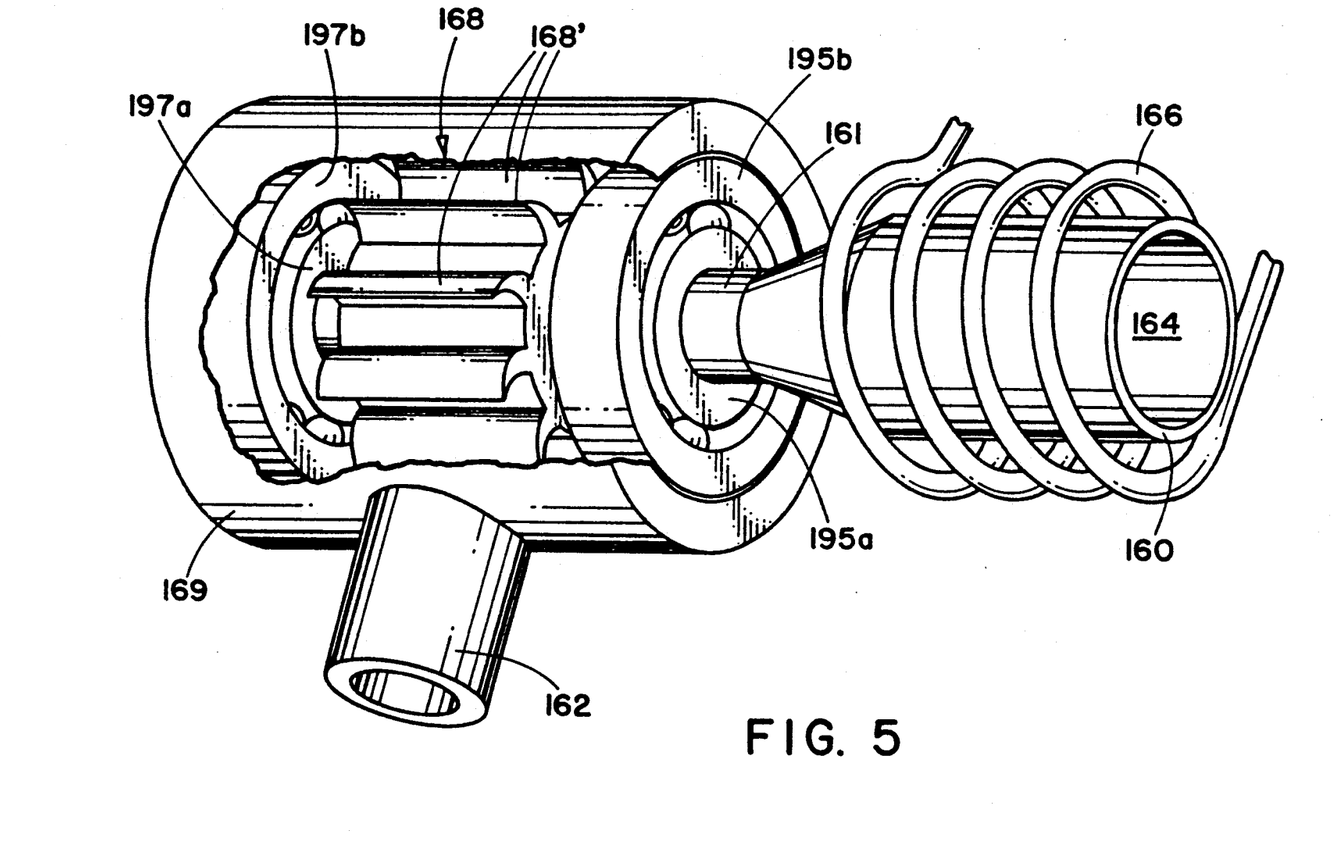
FIG. 5 is a cut-away sectional isometric view of another preferred spinning apparatus of the invention (enlarged) including a stator assembly and illustrating a possible location of a radio-frequency (RF) coil.

The enlarged alternative spinning apparatus of FIG. 5 illustrates the turbine blades 168' of turbine 168 housed in stator assembly 169. To spin inner holder 160, a stream of fluid directed at turbine 168 from a port (not shown and which extends outwardly from stator assembly 169). The fluid is, then, exhausted from exhaust pipe 162. Ball bearing outer rings 195b, 197b are mounted in stator assembly 169. Ball bearing inner rings 195a, 197a support the shaft 161 of inner holder 160 while in rotation. Although shown as ball bearings, the two illustrated bearings can be suitable combinations of annular ball bearings, annular roller bearings, or lubricated sleeve bearings or bushings (see also discussion of FIGS. 2a-2d). Samples (not shown, but which could be a fluid or solid plug, powder, or pieces) will be placed into cavity 164 of inner holder 160 for spectrum analysis. The positioning of an RF trans-ceiver coil, such as that at 160, around sample cavity 164 is necessary to produce sample spectra.

Figure 6:
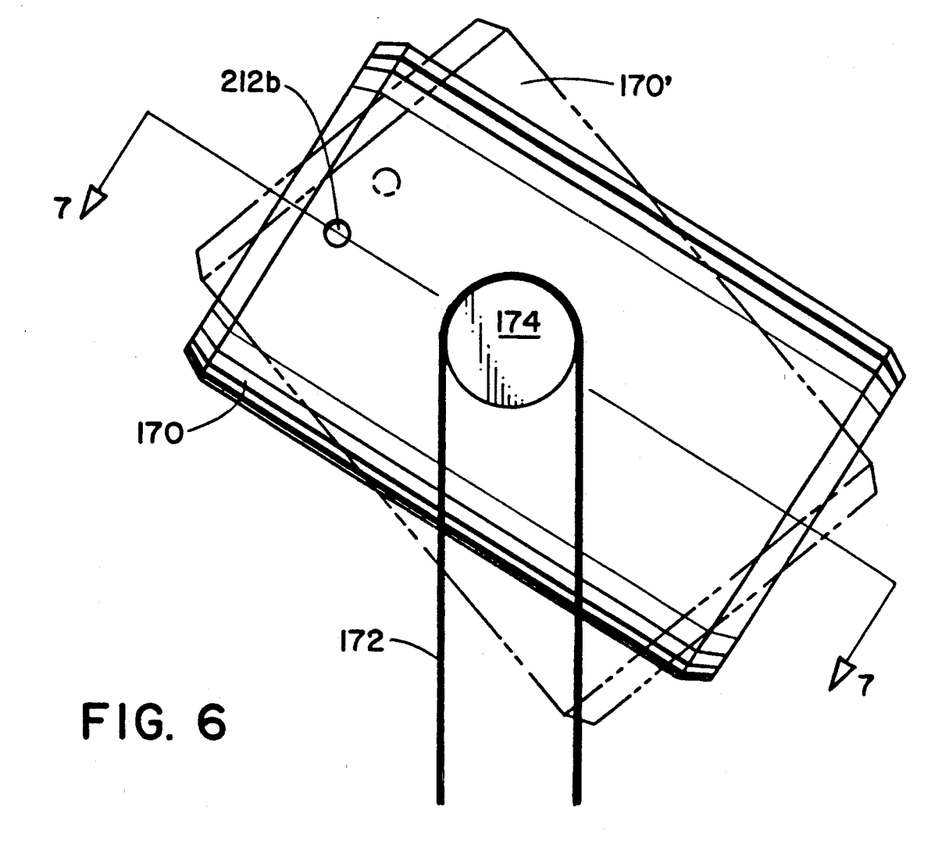
FIG. 6 is a left-hand elevational side view of the outer housing of the alternative spinning apparatus in FIG. 7.

The elevational side view in FIG. 6 illustrates pivot shaft 174 (shown as the right-hand shaft in FIG. 7) assembled with outer housing 170 and belt 172. Outer housing 170' is shown in phantom to indicate its extended pivot location after the right-hand length of belt 172 has been pulled downwardly. A suitable pulley-linkage mechanism (not shown) capable of producing the desired pivot movement of inner holder 200 (in FIG. 7) is attached to belt 172.

Figure 7:
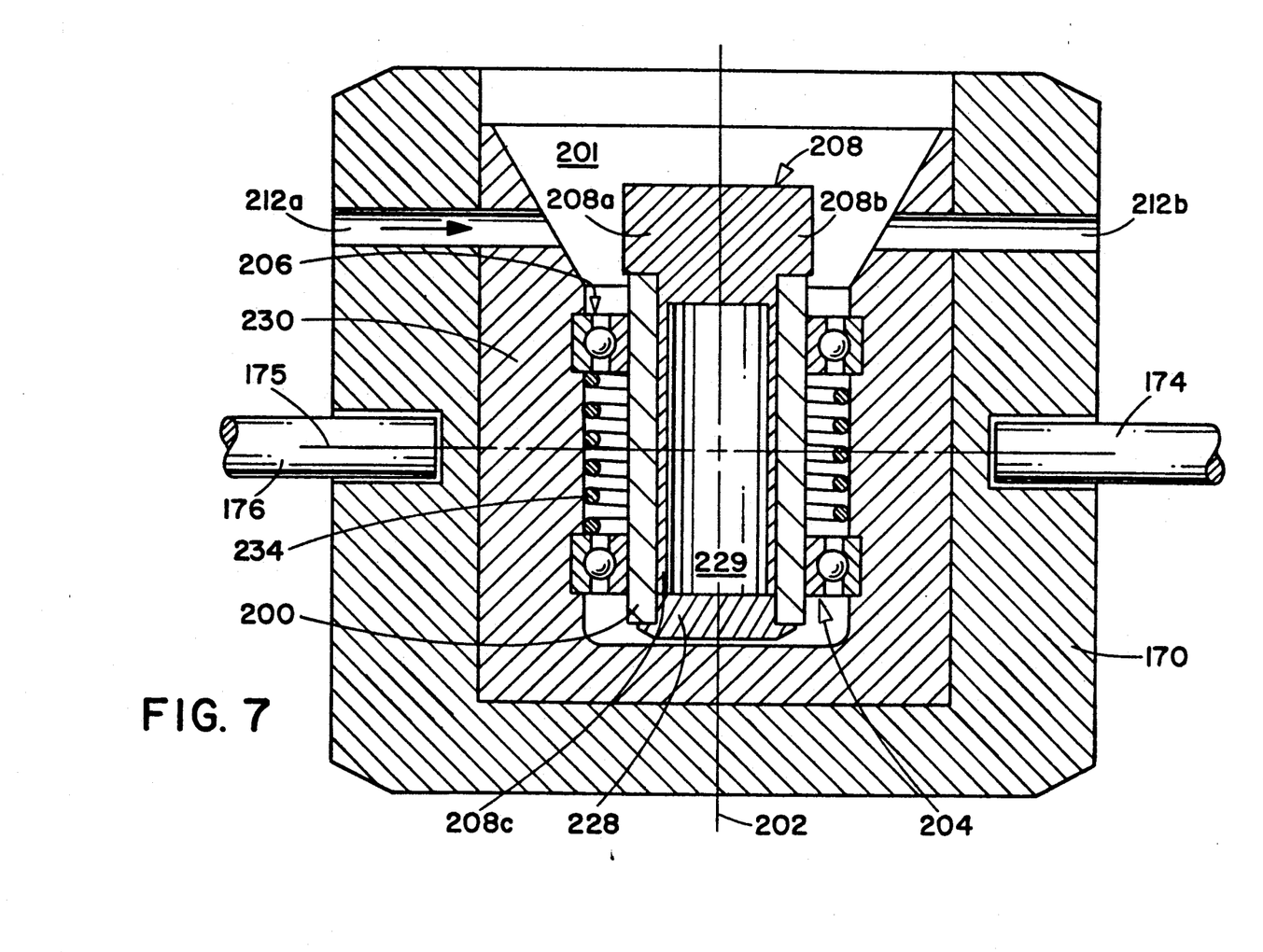
FIG. 7 is a sectional view (taken along 7—7 in FIG. 6) of an alternative preferred spinning apparatus of the invention.

Inner holder 20 of FIG. 7, typically made of glass or a ceramic is used for holding a sample (not shown, but which could be a fluid or solid plug, powder, or pieces) in cavity 229 between end-plugs 228 and 208. Incorporated within end-plug 208, are turbine blades such as those at 208a, 208b. End-plug 208 also has a cylindrical extension 208c which slides along the walls of inner holder 200 when the inner holder 200 is assembled with end-plug 208. Cylindrical extension 208c aids in inserting and removing samples such as solid plugs. End-plugs 228, 208 can be made of a ceramic or a plastic material such as VESPEL ® or TORLON ®.

To spin inner holder 200 about its axis 202, a stream of fluid such as air or nitrogen gas is directed at endplug/turbine 208 through passages 212a, 212b. Stator cavity 201 provides room for turbine blades 208a, 208b to rotate.

Mechanical bearings 204 and 206 are mounted to stator assembly 230 to support the inner holder. Bearings 204, 206 can be press-fit around inner holder 200. Although shown as ball bearings, the two bearings 204, 206 can be suitable combinations of annular ball bearings, annular roller bearings, or lubricated sleeve bearings or bushings (see also discussion of FIGS. 2a-2d). Surrounding inner holder 200 is an RF trans-ceiver coil 234. It is important to position RF coil 234 so that a sample being analyzed is within a homogeneous part of the RF field generated by the coil. Outer housing 170, which retains stator assembly 230, has pivot shafts 174, 176 (and pivot axis 175) about which the spinning apparatus of FIG. 7 pivots (see also FIG. 6). Belt 172 shown in FIG. 6 is absent from FIG. 7 for simplicity. The apparatus of FIGS. 6 and 7 utilizes aspects of the NMR spectroscopy sample spinning technique often referred to as DAS.

Figure 8:
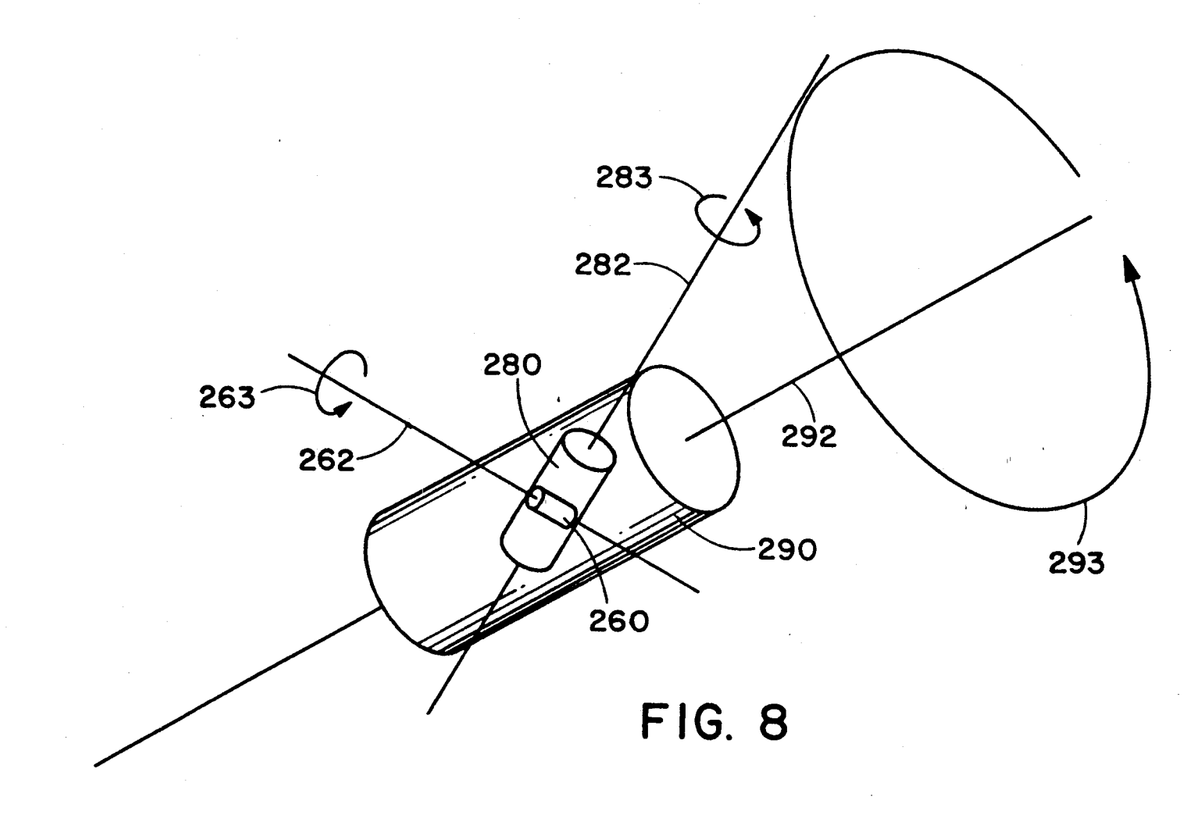
FIG. 8 is a schematic representing the relative angles at which a spinning sample holder, outer housing, and exterior housing are oriented in an alternative spinning apparatus of the invention.

The schematic representation in FIG. 8 illustrates an inner sample holder 260 spinning about its axis 262 in direction 263, an outer housing 280 spinning about its axis 282 in direction 283, and an exterior housing 290 spinning about its axis 292 in direction 293. Note that each axis is oriented in a different direction. See also FIG. 3 (inner holder 60 and outer housing 100) which illustrates mechanical components suitable for spinning inner holder 260 and outer housing 280 of FIG. 8.

By way of example only, a spinning apparatus similar to that shown in FIGS. 3 and 4 was fabricated having: an inner zirconia oxide holder of length 0.75" and outer diameter 0.125" and end-plugs made of DuPont's KEL-F ®; a turbine made of TORLON ® located between two ball bearings (outer diameter 0.500") manufactured by MPB Corporation with silicon nitride spheres, inner and outer rings of silicon nitride, and separator/retainer halves of nylon; a stator assembly of VESPEL ® having an outer diameter of 0.400", the ball bearings having been press-fit into the stator assembly; an outer housing machined of TORLON ® having a length 2.4" and outer diameter of 1.5". By way of a second example only, a spinning apparatus similar to that shown in FIG. 5 was fabricated having an inner holder made of TORLON ® and an RF trans-ceiver coil designed in accordance with known coil design techniques made of copper or platinum.

While certain representative embodiments and details have been shown for the purpose of illustrating the invention, it will be apparent to those skilled in this art that various modifications may be made to the invention without departing from the spirit or scope of the invention.

What is claimed is:

1. A spinning apparatus for conducting magnetic resonance spectroscopy on a sample, comprising:
   an inner holder for the sample, having an inner holder axis and a first and second end-portion;
   means for spinning said inner holder, while positioned in a magnetic field, about said inner holder axis; and
   a substantially nonmagnetic mechanical first bearing for supporting said first end-portion.

2. The apparatus of claim 1 wherein said first bearing comprises an annular ball bearing.

3. The apparatus of claim 2 wherein said annular ball bearing comprises a plurality of spheres made of a material selected from the group consisting of ceramics, glasses, and high strength wear-resistant plastics.

4. The apparatus of claim 2 wherein said annular ball bearing comprises a plurality of spheres and an inner and outer ring, said rings made of a material selected from the group consisting of ceramics, glasses, and high strength wear-resistant plastics.

5. The apparatus of claim 1 wherein said first bearing comprises an annular roller bearing.

6. The apparatus of claim 5 wherein said annular roller bearing comprises a plurality of rollers made of a material selected from the group consisting of ceramics, glasses, and high strength wear-resistant plastics.

7. The apparatus of claim 5 wherein said annular roller bearing comprises a plurality of rollers and an inner and outer ring, said rings made of a material selected from the group consisting of ceramics, glasses, and high strength wear-resistant plastics.

8. The apparatus of claim 1 wherein said first bearing comprises a lubricated sleeve bearing.

9. The apparatus of claim 1 wherein said first bearing comprises a lubricated bushing.

10. The apparatus of claim 1 further comprising a substantially nonmagnetic, substantially nonconductive mechanical second bearing for supporting said second end-portion.

11. The apparatus of claim 10 wherein the sample comprises a solid.

12. The apparatus of claim 10 wherein the sample comprises a fluid.

13. The apparatus of claim 1 wherein said means for spinning comprises a first turbine located around a circumference of said inner holder and a stream of fluid directed at said first turbine.

14. The apparatus of claim 13 further comprising a stator assembly surrounding said inner holder and a port through said stator assembly for said stream of fluid, and wherein said first bearing is mounted inside said stator assembly.

15. The apparatus of claim 14 further comprising a substantially nonmagnetic, substantially nonconductive mechanical second bearing for supporting said second end-portion, said second bearing mounted inside said stator assembly.

16. The apparatus of claim 1 further comprising:
    a stator assembly surrounding said inner holder, said first bearing mounted inside said stator assembly;
    an outer housing for retaining said stator assembly, said outer housing having a pivot axis generally perpendicular to said inner holder axis; and
    means for flipping said outer housing about said pivot axis.

17. A spinning apparatus for conducting magnetic resonance spectroscopy on a sample, comprising:
    an inner holder for the sample, having an inner holder axis and a first and second end-portion;
    said first end-portion comprising a shaft;
    means for spinning said inner holder, while positioned in a magnetic field, about said inner holder axis; and
    a substantially nonmagnetic mechanical first bearing for supporting said shaft.

18. The apparatus of claim 17 wherein said first bearing comprises a plurality of spheres made of a material selected from the group consisting of ceramics, glasses, and high strength wear-resistant plastics.

19. The apparatus of claim 17 further comprising a substantially nonmagnetic mechanical second bearing for supporting said shaft, and wherein said means for spinning comprises:
    a first turbine located around a circumference of said shaft between said first and second bearings; and
    a stream of fluid directed at said first turbine.

20. The apparatus of claim 17 further comprising a substantially nonmagnetic, substantially nonconductive mechanical second bearing for supporting said shaft, and wherein said first and second bearings each comprise spheres.

21. A spinning apparatus for conducting magnetic resonance spectroscopy on a sample, comprising:
    an inner holder for the sample, having an inner holder axis and a first and second end-portion;
    means for spinning said inner holder, while positioned in a magnetic field having a direction, about said inner holder axis;
    a first and second bearing for supporting, respectively, said first and second end-portions;
    an outer housing for retaining said inner holder, said outer housing having an outer housing axis and a right and left end-portion;
    means for spinning said outer housing about said outer housing axis; and
    a substantially nonmagnetic mechanical third bearing for supporting said right end-portion.

22. The apparatus of claim 21 wherein said third bearing comprises a plurality of spheres made of a material selected from the group consisting of ceramics, glasses, and high strength wear-resistant plastics.

23. The apparatus of claim 21 further comprising a substantially nonmagnetic mechanical forth bearing for supporting said left end-portion.

24. The apparatus of claim 21 wherein said inner holder axis, said outer housing axis, and said magnetic field direction are oriented non-parallel.

25. The apparatus of claim 21 further comprising:
    an exterior housing for retaining said outer housing, said exterior housing having an exterior housing axis; and
    means for spinning said exterior housing about said exterior housing axis.

26. The apparatus of claim 21 wherein: said means for spinning said inner holder comprises a first turbine located around a circumference of said inner holder and a stream of fluid directed at said first turbine; and said means for spinning said outer housing comprises a second turbine located around a circumference of said right end-portion.

27. A device for measuring the magnetic resonance spectrum of a sample, comprising:
    an inner holder for the sample, having an inner holder axis and a first and second end-portion;

means for spinning said inner holder, while positioned in a magnetic field, about said inner holder axis;

a substantially nonmagnetic mechanical first bearing for supporting said first end-portion;

a radio-frequency coil surrounding at least a portion of the sample; and means for receiving a magnetic resonance signal emitted from the sample (can be a separate receiver-coil).

28. The apparatus of claim 27 further comprising a substantially nonmagnetic, substantially nonconductive mechanical second bearing for supporting said second end-portion.

29. The apparatus of claim 27 wherein said means for receiving comprises said radio-frequency coil.

* * * * *